United States Patent [19]
Wilczak et al.

[11] Patent Number: 5,545,506
[45] Date of Patent: Aug. 13, 1996

[54] METHOD OF PRODUCING AN IMAGE USING A NEGATIVE WORKING, PEEL DEVELOPABLE, SINGLE SHEET COLOR PROOFING SYSTEM

[75] Inventors: Wojciech A. Wilczak, Jersey City, N.J.; Stephan J. W. Platzer, Eltville, Germany; David L. Siegfried, Langhorne, Pa.

[73] Assignee: Hoechst Celanese Corporation, Somerville, N.J.

[21] Appl. No.: 903,701

[22] Filed: Jun. 24, 1992

Related U.S. Application Data

[63] Continuation-in-part of Ser. No. 827,189, Jan. 28, 1992, abandoned.

[51] Int. Cl.$^6$ ........................................................ G03C 3/00
[52] U.S. Cl. .......................... 430/253; 430/254; 430/257; 430/260; 430/143; 430/293; 430/256
[58] Field of Search ................................. 430/253, 257, 430/254, 260, 143, 256, 293

[56] References Cited

U.S. PATENT DOCUMENTS

| | | |
|---|---|---|
| 3,615,435 | 10/1971 | Chu et al. . |
| 4,050,936 | 9/1977 | Takeda et al. . |
| 4,247,619 | 1/1981 | Cohen et al. . |
| 4,762,766 | 8/1988 | Melbye ................................ 430/143 |
| 4,933,258 | 6/1990 | Shinozaki et al. ................... 430/260 |
| 5,039,590 | 8/1991 | Platzer et al. ....................... 430/253 |
| 5,049,476 | 9/1991 | Platzer ................................. 430/257 |
| 5,236,806 | 8/1993 | Platzer et al. ....................... 430/254 |
| 5,294,515 | 3/1994 | Wilczak et al. ..................... 430/253 |

FOREIGN PATENT DOCUMENTS

| | | |
|---|---|---|
| 2010619 | 2/1990 | Canada . |
| 0277038 | 8/1988 | European Pat. Off. . |
| 0323191 | 7/1989 | European Pat. Off. . |
| 041363 | 2/1991 | European Pat. Off. . |

*Primary Examiner*—Geraldine Letscher
*Attorney, Agent, or Firm*—Richard S. Roberts; Andrew F. Sayko, Jr.; Palaiyur S. Kalyanaraman

[57] ABSTRACT

This invention relates to negative working color proofing sheet constructions which, upon exposure to an actinic radiation source through a screened image, can accurately reproduce said image. The construction is useful as a color proofing film which can be employed to accurately predict the image quality from a lithographic printing process. The image is produced by forming a composite of a receiver sheet, an adhesive layer, a color layer and cover sheet. Upon imagewise exposure, a negative image appears on the receiver base after dry peel apart development.

18 Claims, No Drawings

METHOD OF PRODUCING AN IMAGE USING A NEGATIVE WORKING, PEEL DEVELOPABLE, SINGLE SHEET COLOR PROOFING SYSTEM

This is a continuation-in-part of application Ser. No. 07/827,189 filed on Jan. 28, 1992, now abandoned.

BACKGROUND OF THE INVENTION

The present invention relates to color proofing films, or more particularly to a negative working, peel-apart photosensitive element capable of producing negative images upon treatment with actinic radiation and peel development.

In the graphic arts, it is desirable to produce a three or more color proof to assist in correcting a set of color separation films prior to using them to produce printing plates. The proof should reproduce the color quality that will be obtained during the printing process. The proof must be a consistent duplicate of the desired halftone image. Visual examination of a color proof should show the color rendition to be expected from press printing using the color separations and any defects on the separations which might need to be altered before making the printing plates.

Color proofing sheets for multicolored printing can be made by using a printing press or proof press. This requires that all of the actual printing steps be performed. Therefore, this conventional method of color proofing is costly and time consuming.

Photoimaging processes can also be used to produce a color proof. There are two general types of photoimaging methods, namely the overlay type and the single sheet type.

In the overlay type of color proofing method, an independent transparent plastic support is used for producing an image of each color separation film by applying a photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This can be accomplished by sequentially applying colorants or colored, photosensitive layers to a single opaque support. This method more closely resembles the actual printing process and eliminates the color distortion inherent in the overlay system. Examples of such single sheet approaches are contained in U.S. Pat. Nos. 3,574,049; 3,671,236; 4,260,673; 4,366,223; 4,650,738; 4,656,114; and 4,659,642.

Various processes for producing single sheet color proofs of an image embodying thermal transfer and photopolymerization techniques are known, for example, from U.S. Pat. Nos. 3,060,023; 3,060,024; 3,060,025; 3,481,736; and 3,607,264. In these processes, a photopolymerizable layer coated on a suitable support is imagewise exposed through a color separation film. The surface of the exposed layer is then pressed into contact with an image receptive surface of a separate element. At least one of the said elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material.

In U.S. Pat. No. 3,721,557, a method for transferring colored images is shown which provides a stripping layer coated between a photosensitive element and a support. When the photosensitive layer is exposed to actinic light and developed, the more soluble portions are selectively removed to produce a visible image. The image carrying support is pressed against an adhesive coated receptor member and the carrier support is subsequently stripped to accomplish the transfer of the image. A fresh layer of adhesive must be applied to the receptor for each subsequent transfer.

U.S. Pat. No. 4,596,757 provides a method for transferring images or solid colors which are subsequently imaged. The photosensitive material comprises a carrier support having sequentially disposed thereon a release layer; a colored, photopolymerizable layer; and an adhesive layer. The material can undergo exposure, lamination to a temporary support, wet development, and then lamination to a receptor sheet. Alternatively, the photosensitive material can be laminated to a receptor sheet, undergo exposure, and then wet processed. Both processes require development in an aqueous medium.

In U.S. Pat. No. 4,489,154, a process is claimed which produces a single layer color proof without wet development. The photosensitive material comprises a strippable cover sheet; a colored photoadherent layer; a nonphotosensitive organic contiguous layer; and a sheet support. The material is exposed and peel developed. The positive or negative image is transferred to a receiver base. A fresh layer of adhesive must be applied to the receptor for each subsequent transfer.

SUMMARY OF THE INVENTION

In the present invention, one produces a negative color proofing article. The article sequentially comprises a strippable cover sheet which is transparent to actinic radiation; a color layer, containing a colorant, a polymeric binder, a polymerizable monomer and, optionally, a photoinitiator; an adhesive layer, containing a linear photosensitive polymer or oligomer containing ethylenically unsaturated, free-radical polymerizable groups and having a Tg from 20°–120° C., optionally, a polymerizable monomer, optionally, with a free radical photoinitiator; and a receiver sheet. A single sheet, negative working color proofing film having improved image quality with very high resolution has been found by using the photosensitive polymer or oligomer in the adhesive layer of the article of this invention.

It has been unexpectedly found that a negative image of very high resolution can be obtained when a polymerizable monomer is present along with a photosensitive polymer or oligomer in the adhesive layer. The article of the present invention provides consistent, high resolution negative images by a peel development process.

The present invention relates to a negative-acting, single sheet color proofing element which comprises, in order:

(i) a strippable, transparent cover sheet;

(ii) a color layer on the cover sheet, the color layer comprises an organic binder, a polymerizable monomer, a colorant, and optionally, a photoinitiator wherein the binder is present in sufficient amount to bind the color layer components into a uniform film, wherein the optional photoinitiator, when present, is present in sufficient amount to initiate polymerization of the polymerizable monomer, i.e., 0 to 30% by weight of the solids in the color layer, preferably 1 to 20%, more preferably 3 to 15%, wherein the polymerizable monomer is present in sufficient amount to provide image differentiation when the element is imagewise exposed to actinic radiation and wherein the colorant is present in an amount sufficient to uniformly color the color layer;

(iii) an adhesive layer directly on the color layer, which adhesive layer comprises a photosensitive polymer or oligomer having ethylenically unsaturated, photocrosslinkable groups and a Tg from about 20 to about 120° C., an optional polymerizable monomer having at least one ethylenically unsaturated group and an optional photoinitiator, wherein the photosensitive polymer or oligomer is present in an amount from 50 to 100% of the solids in the adhesive layer, preferably 65 to 90%; wherein the optional photoinitiator is present in sufficient amount to initiate polymerization of the polymerizable monomer and the crosslinking of the photosensitive polymer or oligomer and wherein the optional polymerizable monomer is present in an amount from 0 to 49% of the solids in the adhesive layer and wherein at least one of either the color layer or the adhesive layer contains a photoinitiator; and (iv) a receiver sheet attached to the adhesive layer.

The present invention also relates to a method for producing a negative image which comprises providing a photosensitive element comprising, in order:

(a) a strippable, transparent cover sheet;

(b) coating a color layer on the cover sheet, the color layer comprises an organic binder, a polymerizable monomer, a colorant, and optionally, a photoinitiator wherein the binder is present in sufficient amount to bind the color layer components into a uniform film, wherein the optional photoinitiator, when present, is present in sufficient amount to initiate polymerization of the polymerizable monomer, i.e., 0 to 30% by weight of the solids in the color layer, preferably 1 to 20%, more preferably 3 to 20%, wherein the polymerizable monomer is present in sufficient amount to provide image differentiation when the photosensitive element is imagewise exposed to actinic radiation and wherein the colorant is present in an amount sufficient to uniformly color the color layer;

(c) overcoating an adhesive layer directly on the color layer, which adhesive layer comprises a photosensitive polymer or oligomer having ethylenically unsaturated, photocrosslinkable groups and a Tg from about 20° to about 120° C., an optional polymerizable monomer having at least one ethylenically unsaturated group and an optional photoinitiator, wherein the photosensitive polymer or oligomer is present in an amount from 50 to 100% of the solids in the adhesive layer, preferably 65 to 90%; wherein the optional photoinitiator is present in sufficient amount to initiate at least one of the following: polymerization of the polymerizable monomer in the color layer, polymerization of the optional polymerizable monomer in the adhesive layer, and crosslinking of the photosensitive polymer or oligomer, i.e., 0 to 30%, preferably 1 to 20%, more preferably 3 to 15% of the solids in the adhesive layer, and the photosensitive polymer or oligomer and wherein the optional polymerizable monomer is present in an amount from 0 to 49% of the solids in the adhesive layer and wherein at least one of either the color layer or the adhesive layer contains a photoinitiator; and (d) laminating a receiver sheet directly to the adhesive layer;

(e) imagewise exposing the color layer and the adhesive layer to actinic radiation through the transparent cover;

(f) peeling apart the receiver sheet and the transparent cover sheet, leaving exposed areas of the color layer on the adhesive layer and unexposed areas being removed with the cover sheet, thereby forming a negative image on the adhesive layer on the receiver sheet; and g) optionally repeating steps a) through f) at least once wherein another photosensitive element having at least one different colorant, according to step b), is transferred via its adhesive layer to the negative image previously produced on the receiver sheet. Optionally a transparent anchoring layer such as those disclosed in U.S. Pat. No. 2,779,684 is provided on the prior negative image on the adhesive layer on the support sheet prior to repeating steps a) through f).

DETAILED DESCRIPTION OF THE PREFERRED EMBODIMENT

In the usual full color proofing guide, four distinct colored images are formed, namely magenta, cyan, yellow, and black. When the images are superimposed upon each other, a simulated full color reproduction results. As hereinbefore described, one begins the process of the present invention by preparing a photosensitive element which has a cover and carried thereon a polymerizable layer.

In the preferred embodiment, the cover sheets may be composed of any suitable flexible sheet material provided it is transparent to the actinic radiation for the color layer and adhesive layer. In the preferred embodiment, it has a surface which is dimensionally stable when undergoing the herein specified treatment process. That is, it should have substantially no change in dimensions under heating in the range of approximately 60° C. to 120° C. during lamination. One preferred material is polyethylene terephthalate. In the preferred embodiment it has a thickness of from about 1 to about 10 mils, a more preferred thickness is from about 2 to about 5 mils and most preferably from about 2 to about 3 mils. Suitable films nonexclusively include Melinex 054, 504, 505, and 582 films available from ICI, and Hostaphan 4400, 4500, and 4540 films available from Hoechst Celanese Corporation. The surface of the support may be smooth or it may be provided with a matte texture as with Melinex 475 film. A smooth surface is preferred because a rough surface scatters the actinic radiation and thereby reduces the resolution capability of the element.

The color layer is applied from a solvent coating composition to the cover sheet. Organic solvents are preferred for the Color layer because of the diverse solubility characteristics of the various components. Typical solvents nonexclusively include methyl ethyl ketone, 2-methoxyethanol, 1-methoxy-2-propanol, 4-hydroxy- 4-methyl-2-pentanone, tetrahydrofuran, diacetone alcohol, and gamma-butyrolactone.

The polymerizable monomer in the color layer and optionally in the adhesive layer preferably comprises an addition polymerizable, non-gaseous (boiling temperature above 100° C. at normal atmospheric pressure), ethylenically-unsaturated compound containing at least one and preferably at least two terminal ethylenically unsaturated groups, and being capable of forming a high molecular weight polymer by free radical initiated, chain propagating addition polymerization. The most preferred compounds are acrylate or methacrylate monomers as are well known in the art. Suitable polymerizable monomers nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, dipentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, and bisphenol A diepoxide dimethacrylate.

Free radical liberating photoinitiators used in the color layer and/or adhesive layer include any compound which liberate free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon-substituted aromatic acyloins in U.S. Pat. No. 2,722,512; polynuclear quinones in U.S. Pat. Nos. 2,951,758 and 3,046,127; and s-triazines in U.S. Pat. Nos. 3,987,037 and 4,189,323. The most preferred photoinitiators include 2,3-di(4-methoxyphenyl)quinoxaline, 9-phenylacridine, 2-biphenyl-4,6-bis-trichloromethyl-5-triazine, bis(2,4,5-triphenyl)imidazole and derivatives of bis-trichloromethyl-s-triazines.

The color layer and adhesive layer may also contain a binding resin which not only determines the hardness and/or flexibility of the coating but is also used to control the dry development. Binding resins found suitable for the color layer are polyvinyl acetates, styrene/maleic anhydride copolymers and their half esters; acrylic polymers and copolymers; polyamides; polyvinyl pyrrolidones; cellulose and its derivatives; phenolic resins; and the like. The most preferred binding resins are polyvinyl acetates and acetals, such as UCAR resins from Union Carbide, and polyvinyl formal, polyvinyl butyral and polyvinyl propional.

Dyes may be included in the color layer or adhesive layer to spectrally sensitize the photoinitiator, such as described in U.S. Pat. Nos. 4,282,309 and 4,454,218, and European Pat. No. Applications 0,179,448 and 0,211,615.

In the preferred embodiment, the dry color layer has a coating weight range of from about 0.1 to about 5 g/m². The more preferred coating weight is from about 0.4 to about 2 g/m².

In the practice of the present invention, the optional photoinitiator component is preferably present in each of the color layer and adhesive layer in an amount ranging from approximately 0 to 30% based on the weight of the solids in the layer. A preferred range is from about 1 to 20%, more preferably from 3 to 15%.

Dyes and/or pigments are included in the color layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color.

Other ingredients which may be present in the color layer are thermal polymerization inhibitors, plasticizers, tackifiers, oligomers, residual solvents, surfactants, inert fillers, antihalation agents, hydrogen atom donors, photoactivators, and optical brightening agents.

In a preferred embodiment of the present invention, the binder component is preferably present in the color layer in an amount sufficient to bind the components in a uniform mixture and a uniform film when it is coated on a substrate. It is preferably present in an amount ranging from about 10 to about 60% based on the weight of the solids in the color layer. A more preferred range is from about 20 to about 50%.

In the preferred embodiments, the polymerizable monomer is present: 1) in the color layer in an amount of from about 5 to about 60% by weight of the total solids in the color layer, more preferably from about 10 to about 50%, and 2) in the adhesive layer from 0 to about 50% by weight of the total solids in adhesive layer, more preferably from about 10 to about 40%.

In the practice of the present invention, the colorant component is preferably present in an amount sufficient to uniformly color the color layer. It is preferably present in an amount ranging from about 5 to about 50% based on the weight of the solids in the color layer. A more preferred range is from about 8 to about 40%.

A plasticizer may also be included in the color or adhesive layer of this invention to prevent coating brittleness and to keep the composition pliable if desired. Suitable plasticizers include dibutylphthalate, triarylphosphate and substituted analogs thereof and preferably dioctylphthalate.

Adhered to the color layer is the adhesive layer. The adhesive layer preferably comprises a photosensitive polymer or oligomer, a photoinitiator, and a polymerizable monomer, as hereinbefore defined.

To form the adhesive layer, the components may be dissolved in a solvent or mixture of solvents to facilitate application of the composition to the substrate. Suitable solvents for this purpose may include water, tetrahydrofuran, isobutyl isobutyrate, glycol ethers such as propylene glycol monomethyl ether and methyl cellosolve, alcohols such as ethanol and n-propanol and ketones such as methyl ethyl ketone. However, the solvent must not deteriorate the previously coated photopolymerizable color layer by dissolving any portion of the color layer. In general, the solvent system is evaporated from the coating composition once it is applied to an appropriate substrate. However, some insignificant amount of solvent may remain as residue.

In the preferred embodiment, the adhesive layer has a coating weight between approximately 2 and 20 g/m². The most preferred weight is from about 4 to 10 g/m².

The adhesive layer optionally contains a polymerizable monomer and may optionally contain such other desired components as uv absorbers, antistatic compositions, optical brighteners, inert fillers, thermal polymerizable inhibitors, residual solvents, surfactants, antihalation agents, hydrogen atom donors, tackifiers, and plasticizers. Suitable polymers or oligomers nonexclusively include: a urethane adduct of Butvar B-79 resin and isocyanatoethyl methacrylate or NEORAD photocrosslinkable acrylates. The adhesive layer may optionally contain a uv absorber such as Uvinul D-50 available from GAF. It may also contain a plasticizer such as Resoflex R-296, available from Cambridge Industries. It may also contain antistats, such as Gafac and Gafstat available from GAF. The adhesive layer should not be tacky to the touch, during storage. The adhesive layer should be transferable to a receiver sheet in a temperature range of from about 50° C. to about 180° C., preferably 60° C. to 120° C., more preferably 60° C. to 100° C. when laminated with heat and pressure. The plasticizer may be present in an amount of up to about 10% by weight and the uv absorber up to about 10% by weight.

Receiver sheets may comprise virtually any material which can withstand the laminating and dry development processes. White plastic sheets, such as adhesion pretreated polyester Melinex 3020 film from ICI, are useful for this purpose. Plastic coated paper sheets, such as polyethylene coated paper from Schoeller, may also be used. Other bases may include wood, glass, metal, paper and the like.

Lamination may be conducted by putting the adhesive layer in contact with the receiver sheet and then introducing the materials into the nip of a pair of heated laminating rollers under suitable pressure. Suitable laminating temperatures usually range from approximately 60° C. to 120° C., preferably from 70° C. to 100° C. The photopolymerizable layer is then laminated under similar conditions to the adhesive layer on the receiver sheet. The adhesive layer and photopolymerizable layer are then simultaneously exposed by means well known in the art. Such exposure may be conducted by exposure to actinic radiation from a light source through a conventional halftone negative color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

After exposure, a negative image is anchored via the adhesive layer on the receiver sheet by stripping the transparent cover sheet from the receiver sheet at room temperature with a steady, continuous motion. The preferred peel angle relative to the peel direction is greater than 90°. The delamination leaves the photoexposed areas of the color layer attached to the adhesive layer on the receiver sheet. The nonexposed areas of the color layer remain on the cover sheet which has been peeled apart from the receiver sheet. Thus, a negative image remains with the adhesive layer on the receiver sheet.

In order to attain a multicolored image, another photosensitive element comprising, in order, a transparent cover sheet, a color layer and an adhesive layer is laminated onto the first image on the receiver sheet, exposed and the second color is dry developed by peeling apart the receiver sheet from the cover sheet of the additional photosensitive element. The second negative image remains with its photosensitive adhesive layer with the first image. A third and a fourth image may be added in a manner similar to that used to produce the second image. In the usual case, four colored layers are employed to produce a full color reproduction of a desired image. These four colors are cyan, magenta, yellow, and black.

In the preferred embodiments, the color proofing sheet further comprises: 1) an anchor layer which has been provided such as by lamination, on the underlying negative color image on the adhesive layer on the receiver sheet or 2) an anchor layer between the adhesive layer and the receiver sheet and between subsequent adhesive layers and underlying negative color images.

A matte finish of the final image may be obtained by embossing the shiny, top surface of the image with a matte material, such as Melinex 377 film from ICI. This is done by laminating together the final image and matte material and peeling the matte material away.

The final four color proof may be given a uniform, blanket exposure to photoharden the exposed, colored areas on the receiver base. A protective layer may also be laminated on top of the last dry developed layer.

The following nonlimiting examples serve to illustrate the invention.

EXAMPLE 1

Three (3) grams of RBX-1000, a photocrosslinkable polymer from Monsanto having ethylenically unsaturated side chains, prepared by reacting a polyvinyl butyral resin having free —OH groups with alpha, alpha-dimethyl-m-isopropenyl benzyl isocyanate were dissolved in 30 g of isobutyl isobutyrate. To 10 grams of the above stock solution of photocrosslinkable adhesive there were added 0.38 g of Sartomer 399 dipentaerythritol pentaacrylate, and 0.09 g of 2-biphenyl-4,6-bis-trichloromethyl-s-triazine.

Color coat solution.

1. Tetrahydrofuran—21.7 g
2. Dowanol PM—43.42 g
3. Diacetone alcohol—16.18 g.
4. Urethane adduct of 1 mole of trimethylhexamethylene diisocyanate with 2 moles of 2-hydroxyethyl-4,6-bis-acryloxyethyl isocyanurate (Aronix M-215, Mitsui)— 3.38 g.
5. 2-biphenyl-4,6-bis-trichloromethyl-s-triazine—0.84 g.
6. Magenta Formvar Dispersion (19.8% solution) (The Dispersion consists, in percent by weight, of: 80.2% gamma-butyrolactone, 9.0 FORMVAR 12/85 resin and 10.8% Permanent Carmine FB)—14.48 g.

The color coat solution was coated on the untreated side of Hostaphan 4407 cover sheet (available from Hoechst Celanese Corporation) with a Meier rod #12, and dried. The color coat was then overcoated with the above adhesive solution with a Meier rod #24 and dried to give a colored photosensitive element.

The receiver base was prepared from Pressmatch Commercial Receiver Base, available from Hoechst Celanese Corporation. A 6% solids solution of Butvar 79 polyvinyl butyral resin (Monsanto) in isopropyl acetate was coated on it with a Meier rod #24 and dried.

The above-described photosensitive element was laminated to the above receiver base using heat and pressure. Thusly prepared composite was imagewise exposed to actinic radiation through the Hostaphan 4407 transparent cover sheet using UGRA target for 15 seconds in a Berkey-Ascor exposure unit. Peeling away the cover sheet resulted in exposed areas of the color coat staying on the adhesive, while unexposed areas of the color coat were removed together with the cover sheet. Thusly obtained negative magenta image anchored to the base via the adhesive showed dot reproduction of 2–98% at 150 lines/inch.

EXAMPLE 2

To prepare the photocrosslinkable adhesive, 50 g of Butvar 79 polyvinyl butyral resin from Monsanto containing free hydroxyl groups (10.5–13%, expressed as % polyvinyl alcohol) was placed in 200 g of isobutyl isobutyrate with stirring, at room temperature. To this solution, there were added 14 g of isocyanatoethyl methacrylate (Monomer, Polymer & Dajac Laboratories, Inc.), along with 0.05 g of dibutyltin dilaureate as catalyst. The mixture was left stirring overnight, and after that time no isocyanate band was seen in the IR spectrum of the polymer. Thus, an adhesive containing methacrylate groups was created.

To 10 g of the above stock solution, there were added 0.38 g of Sartomer 399 Dipentaerythritol pentaacrylate, as monomer, and about 0.1 g of 2-biphenyl-4,6-bis-trichloromethyl-s-triazine as initiator, completing the adhesive formulation.

This adhesive solution was used in place of the adhesive solution from Example 1, and the procedure was repeated. The negative image obtained had a resolution of 2–99% on 150 lines/inch screen.

COMPARATIVE EXAMPLE 3

To prepare a non-crosslinkable adhesive, 50 g of Butvar 79 resin was placed in 200 g of isobutyl isobutyrate with stirring at room temperature. To this solution, there were added 9 grams of n-butyl isocyanate (Aldrich Chemicals) along with 0.05 g of dibutyltin dilaureate as catalyst. The mixture was left stirring overnight. After that time no isocyanate band was seen in the IR spectrum of the polymer. Thus, an adhesive incapable of free-radical crosslinking was created.

To 10 g of the above stock solution, there were added 0.38 g of Sartomer 399 dipentaerythritol pentaacrylate, and 0.09 g of 2-biphenyl-4,6-bis-trichloromethyl-s-triazine as photoinitiator.

This adhesive solution was used in place of adhesive solution in Example 1, and the procedure was repeated. No image was obtained even after prolonged exposure to actinic light.

EXAMPLE 4

A coating solution consisting of 9.31 g tetrahydrofuran, 18.58 g Dowanol PM propylene glycol monomethyl ether from Dow Chemical, 6.97 g diacetone alcohol (4-hydroxy-4-methyl-2-pentanone), 1.29 g SR-399 monomer (dipentaerythritol pentaacrylate) from Sartomer Company, 0.45 g Formvar 12/85 Polyvinyl formal resin from Monsanto, 0.36 g 2-[1,1'-biphenyl]-4-yl-4,6 -bis(trichloromethyl)-1,3,5-triazine and 13.04 g magenta dispersion (which consists of 11.606 g gamma-butyrolactone, 0.789 g Formvar 12/85 resin, and 0.645 g Permanent Carmine FBB-02 pigment from Hoechst Celanese Corporation) was prepared. This solution was coated onto a 3 mil sheet of Melinex 516 polyester cover sheet (ICI Films) using a #8 Meier drawdown rod. After drying in a forced air oven, the magenta color coat was overcoated with NeoRad NR-3800 waterborne, 40 percent solids, radiation curable acrylic polymer from ICI Resins US using a #32 Meier rod to obtain 6 g/m$^2$ coating after drying. The NeoRad NR-3800 polymer formed a clear tack-free coating upon drying. The photosensitive element was laminated to Pressmatch® Commercial Receiver Stock using a 3M Model 447 Matchprint® Laminator with the upper roller set at 270° F. and the lower roller set at 200° F. The laminated composite comprising (from bottom to top) Receiver Stock/NeoRad 3800 polymer/Magenta Color Coat/Melinex 516 cover sheet, was placed in a Theimer Montakop exposure frame with an UGRA Plate Control Wedge (1982©) on top of the Melinex 516 cover sheet. Exposure was carried out with a 5 kilowatt Multispectrum Xenon metal halide bulb for 34 seconds. When the Melinex 516 cover sheet was peeled away a negative image had been developed which remained adhered to the adhesive layer. The background area where no exposure to light occurred was clear; all of the magenta color layer remained adhered to the Melinex 516 cover sheet in the light-exposed regions. Dot reproduction was 5 percent highlight dots, 95 percent shadow dots (H.D./S.D.) at 150 lines/inch.

EXAMPLE 5

The following two magenta color coat solutions were prepared:

| Component | A | B |
| --- | --- | --- |
| Tetrhydrofuran | 10.85 g | 10.39 g |
| Dowanol PM ether | 21.71 | 20.77 |
| Diacetone Alcohol | 8.09 | 7.74 |
| Sartomer-399 Monomer | 1.69 | 1.27 |
| 2-[1,1'-biphenyl]-4-yl-4,6-bis (trichloromethyl-5-triazine) | 0.42 | 0.42 |
| Magenta Dispersion (19.8% solids) | 7.24 | 9.41 |
| Total: | 50.00 g | 50.00 g |

Using the same procedure as in Example 4, these solutions were coated on the untreated side of two-mil-thick Hostaphan 4407 polyester film (a one-sided adhesion-promoted film from Hoechst Celanese Corporation) to an optical density of 1.2 as measured with an X-Rite Densitometer using the green filter. The dried magenta color coats were overcoated using NeoRad NR-3800 polymer with 4 percent by weight of Darocur 2273 photoinitiator, a proprietary mixture of aromatic ketones and aromatic amine, from EM Industries, Inc., Advanced Chemicals Division, 5 Skyline Drive, Hawthorne, N.Y. 10532. Exposure with Ugra targets and subsequent peel development yielded:

| | A | | B | |
| --- | --- | --- | --- | --- |
| Exposure Time, TU | H.D. | S.D. | H.D. | S.D. |
| 24 (6 seconds) | 4% | 96% | — | — |
| 35 | 5% | 95% | 5% | 95% |

EXAMPLE 6

In the same manner, a coating solution containing yellow dispersion (which consisted of 80.2% gamma-butyrolactone, 10.7% Formvar 12/85 resin, and 9.1% Permanent Yellow GR pigment from Hoechst Celanese) was prepared with 10.97 g tetrahydrofuran, 21.95 g Dowanol PM ether, 8.18 g diacetone alcohol, 1.49 g Sartomer 399 dipentaerythritol pentaacrylate, 0.37 g 2-[1,1'-biphenyl]-4-yl-4,6-bis-(trichloromethyl-5-triazine) photoinitiator, and 7.04 g yellow dispersion. The untreated side of a two-mil sheet of Hostaphan 4407 film was coated to an optical density of 0.93 (blue filter, X-Rite Densitometer). As done in Example 4, NeoRad NR-3800 polymer was overcoated, dried, laminated, and the sample was exposed through an Ugra target, and peel development conducted. Dot reproduction consisted of 4% H.D. and 96% S.D. with an exposure of 50 TU (12 seconds).

EXAMPLE 7

In the same manner, a coating solution containing cyan dispersion (which consisted of 80.2% gamma-butyrolactone, 8.7% Formvar 12/85, and 11.1% Hostaperm Blue B2G pigment from Hoechst Celanese) was prepared with 10.66 g tetrahydrofuran, 21.32 g Dowanol PM ether, 7.94 g diactone alcohol, 1.58 g Sartomer 399 dipentaerythritol pentaacrylate, 0.40 g 2-[1,1'-biphenyl]-4-yl-4,6 -bis(trichloromethyl-5-triazine) photoinitiator, and 8.10 g cyan dispersion. The untreated side of a two-mil sheet of Hostaphan 4407 film was coated to an optical density of 1.6 (red filter, X-Rite Densitometer). As done in Example 5, NeoRad NR-3800 polymer with 4% Darocure 2273 photoinitiator was overcoated, dried, laminated, and the sample was exposed for 13 seconds through an Ugra target. The Hostaphan 4407 cover sheet was peeled apart to yield a negative image with dot reproduction of 4/95 H.D./S.D.

EXAMPLE 8

In the same manner, a coating solution containing black dispersion (which consisted of 80.2% gamma-butyrolactone, 8.8% Formvar 12/85 resin, and 11.0% Printex 25 carbon black from Degussa Corporation) was prepared with 11.47 g tetrahydrofuran, 22.93 g Dowanol ether, 8.54 g diacetone alcohol, 1.20 g Sartomer 399 dipentaerythritol pentaacrylate, 0.30 g 2-[1,1'-biphenyl]-4-yl-4,6-bis(trichloromethyl-5-triazine) photoinitiator, and 5.56 g black dispersion. The untreated side of a two-mil sheet of Hostaphan 4407 film was coated to an optical density of 1.5. Again, NeoRad 3800 resin with 4% Darocur 2273 photoinitiator was overcoated, dried, laminated, and the sample was exposed for 73 seconds through an Ugra target. Peel development produced dot reproduction of 5/96 H.D./S.D.

EXAMPLE 9

To prepare a four-color proof, the color coats described in Example 6 for yellow, Example 5(A) for magenta, Example 7 for cyan, and Example 8 for black were coated on the untreated sides of two-mil sheets of Hostaphan 4407 film. These color coats were overcoated with NeoRad NR-3800 resin as described in Example 4. Using a color sequence of yellow, magenta, cyan, and black, a high resolution color proof that closely resembled a printed copy was assembled. Each color faithfully reproduced fine detail as it was assembled in the above color sequence, and the peel development process did not disturb the image of the underlying colors, i.e. adhesion characteristics of color to adhesive and vice versa were suitable for building up the four-color proof composite.

EXAMPLE 10

This example shows a preparation of a four-color proof using the present invention. The formulations for the color layers include the following ingredients in parts by weight.

| Ingredient - Color Layer | Cyan | Yellow | Magenta | Black |
| --- | --- | --- | --- | --- |
| Tetrahydrofuran | 200 | 200 | 200 | 200 |
| 4-hydroxy-4-methyl pentanone | 150 | 150 | 150 | 150 |
| 1-methoxy-2-propanol | 444 | 465 | 489 | 490 |
| Formvar 12/85 resin | 12 | 13 | 15 | 18 |
| Urethane adduct of 100 parts | 16 | 24 | 16 | 24 |
| Desmophen 1700 (Bayer), and 12 parts of isocyanatoethyl-methacrylate | | | | |
| Hostaperm B2G | 14 | — | — | — |
| Permanent Yellow GR | — | 14 | — | — |
| Permanent Red FBB | — | — | 24 | — |
| Printex 25 | — | — | — | 24 |

The pigments were dispersed in some of the Formvar 12/85 and solvents. The color solutions were coated on the untreated side of 2 mil Hostaphan 4407 polyester cover sheets with a Meier rod #12 and dried. The photosensitive adhesive solution from Example 2 was overcoated on each color layer with a Meier rod #24, and dried. The receiver base for the four-color proof was prepared from Pressmatch Commercial Receiver Base overcoated with Butvar 79 resin solution in n-butyl acetate, and dried. The first photosensitive element, magenta, was laminated to the receiver base by using heat and pressure, and imagewise exposed to actinic radiation through the transparent Hostaphan 4407 polyester cover sheet for 10 seconds. Upon peeling away the polyester cover sheet, the unexposed areas of the color layer were removed along with it, while the exposed areas of the color layer remained anchored to the base via the photosensitive adhesive. Thus, a negative image was created on the receiver base, while a positive image was removed together with the transparent carrier sheet. The second photosensitive element, yellow, was in turn laminated to the previously created negative magenta image. Upon imagewise exposure to actinic light via a target in registration with the previous image, and peeling away the polymer sheet, the yellow negative image was created, attached to the previous image via the photosensitive adhesive. Repeating the above procedure for the remaining two colors resulted in a high quality negative color proof with the dot reproduction of 2–98% on 150 lines/inch screen.

EXAMPLE 11

This example describes a four color proof having an anchoring layer in contact with the adhesive layer of each color. The color solutions were prepared, coated, and overcoated with photosensitive adhesive as described in Example 10. The anchoring layer (10% Butvar 79 resin in n-butyl acetate) was coated on a separate sheet of Melinex 516 polyester with a Meier rod #12, and dried. The first photosensitive element, magenta, was laminated to the receiver base described in Example 10, imagewise exposed, and peel-developed. Then the Melinex 516 polyester sheet carrying the anchoring layer was laminated to the negative magenta image using heat and pressure, and the polyester sheet was peeled away, leaving the anchoring layer directly on top of the magenta image. Then, the second photosensitive element, yellow was laminated to this anchoring layer, and the exposure and peel procedure was repeated. Then, the next anchoring layer was laminated to the yellow image, and the polyester was stripped away, leaving the anchoring layer ready for accepting the next color. Repeating the above procedure produced a high quality four-color negative proof having an anchoring layer under each photosensitive adhesive layer.

EXAMPLE 12

This example describes the application of the anchoring layer to each photosensitive element before lamination to receiver base and exposure.

The four photosensitive elements were prepared as in Examples 10 and 11. Then, the anchoring layer on Melinex 516 film (Example 11) was laminated to each photosensitive element using heat and pressure, and the Melinex 516 film was peeled away, leaving the following elements, from top to bottom:

Hostaphan 4407 Cover Sheet

Color Layer

Photosensitive Adhesive Layer

Anchoring Layer

The four-color proof was prepared from these elements, using the procedure outlined in Example 10.

EXAMPLE 13

Example 10 was repeated, except Melinex 516 film (ICI) was used as the carrier for the color coat, instead of the untreated Hostaphan 4407 film. A good quality color proof was obtained.

What is claimed is:

1. A method for producing a negative image which comprises providing a photosensitive element comprising, in order:

(a) a strippable, transparent cover sheet;

(b) coating a color layer on the cover sheet, the color layer comprises an organic binder, a polymerizable monomer and a colorant, wherein the binder is present in sufficient amount to bind the color layer components into a uniform film, wherein the polymerizable monomer is present in sufficient amount to provide image differentiation when the photosensitive element is imagewise exposed to actinic radiation and wherein the colorant is present in an amount sufficient to uniformly color the color layer;

(c) overcoating an adhesive layer directly on the color layer, which adhesive layer comprises a photosensitive polymer or oligomer having ethylenically unsaturated, photocrosslinkable groups and a Tg from about 20° to about 120° C., wherein the photosensitive polymer or oligomer is present in an amount from 60 to 100%, and wherein at least one of said color layer and said adhesive layer contains a photoinitiator; and (d) laminating a receiver sheet directly to said adhesive layer;

(e) imagewise exposing said color layer and said adhesive layer to actinic radiation through said transparent cover sheet;

(f) peeling apart said receiver sheet and said transparent cover sheet, leaving exposed areas of said color layer on said adhesive layer and unexposed areas being removed with said cover sheet, thereby forming a negative image on said adhesive layer on said receiver sheet; and g) optionally repeating steps a) through f) at least once wherein another second photosensitive element having at least one different colorant, according to step b), is transferred via its adhesive layer to the negative image previously produced on said receiver sheet.

2. The method of claim 1 wherein said adhesive layer comprises said photosensitive polymer, a photoinitiator and a polymerizable monomer.

3. The method of claim 1 wherein said color layer further comprises a photoinitiator.

4. The method of claim 1 or 2 wherein said polymerizable monomer comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, di-pentaerythritol pentaacrylate, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, and bisphenol A diepoxide dimethacrylate.

5. The method of claim 2 or 3 wherein said photoinitiator comprises one or more photoinitiators selected from the group consisting of 2,3-di(4 -methoxyphenyl)quinoxaline, 9-phenylacridine, bis(2,4,5-triphenyl)imidazole, bis-trichloromethyl-s-triazine and their derivatives.

6. The method of claim 1 wherein said color layer comprises one or more binding resins selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers.

7. The method of claim 2 wherein the polymerizable monomer is present in said adhesive layer in an amount ranging from about 65% to about 90% by weight of said adhesive layer.

8. The method of claim 2 wherein the photoinitiator component is present in said adhesive layer in an amount ranging from about 1% to about 20% by weight of said adhesive layer.

9. The method of claim 1 wherein the binder is present in said color layer in an amount ranging from about 10% to about 60% by weight of said color layer.

10. The method of claim 1 wherein said receiver sheet comprises polyethylene terephthalate.

11. The method of claim 1 wherein said cover sheet comprises polyethylene terephthalate.

12. The method of claim 1 wherein a transparent anchor layer is laminated to a negative image produced on the receiver sheet prior to each repetition of steps a) through f).

13. The method of claim 2 wherein said color layer comprises a binder selected from the group consisting of styrene/maleic anhydride copolymers and their half esters; acrylic polymers and copolymers; polyamides; polyvinyl pyrrolidones; cellulose and its derivatives; phenolic resins; polyvinyl acetals; polyvinyl acetates and their copolymers.

14. The method of claim 1 wherein said color layer further comprises one or more ingredients selected from the group consisting of plasticizers, tackifiers, stabilizers, antistatic compositions, uv absorbers, spectral sensitizers, optical brighteners, inert fillers, exposure indicators, polymerization inhibitors, surfactants, hydrogen atom donors, antihalation agents, and photoactivators.

15. The method of claim 1 wherein the coating weight of the adhesive layer ranges from about 2 to 20 g/m$^2$.

16. The method of claim 1 wherein said adhesive layer further comprises one or more ingredients selected from the group consisting of plasticizers, tackifiers, stabilizers, antistatic compositions, uv absorbers, spectral sensitizers, optical brighteners, inert fillers, exposure indicators, polymerization inhibitors, surfactants, hydrogen atom donors, antihalation agents, and photoactivators.

17. The method of claim 1 wherein each lamination is conducted at a temperature of from about 60° C. to about 120° C.

18. The method of claim 1 further comprising the subsequent step of providing an anchor layer on the negative image on the adhesive layer on the receiver sheet.

* * * * *